United States Patent [19]
Miyashita et al.

[11] Patent Number: 5,875,133
[45] Date of Patent: Feb. 23, 1999

[54] SEMICONDUCTOR MEMORY DEVICE AND A METHOD FOR STEPPING UP ITS WORD LINES

[75] Inventors: Koji Miyashita; Takashi Kumagai; Yasunobu Tokuda, all of Nagano-ken, Japan

[73] Assignee: Seiko Epson Corporation, Tokyo, Japan

[21] Appl. No.: 809,383

[22] PCT Filed: Jul. 19, 1996

[86] PCT No.: PCT/JP96/02018

§ 371 Date: Jun. 19, 1997

§ 102(e) Date: Jun. 19, 1997

[87] PCT Pub. No.: WO97/04458

PCT Pub. Date: Feb. 6, 1997

[30] Foreign Application Priority Data

Jul. 21, 1995 [JP] Japan .................................. 7-186017

[51] Int. Cl.$^6$ .................................................. G11C 16/04
[52] U.S. Cl. ................................... 365/189.09; 365/233.5
[58] Field of Search .......................... 365/189.09, 233.5, 365/230.03, 156; 327/536

[56] References Cited

U.S. PATENT DOCUMENTS 4,730,132  3/1988  Watanabe et al. .................. 365/189.09

FOREIGN PATENT DOCUMENTS

| | | |
|---|---|---|
| 58-169958 | 10/1983 | Japan . |
| 59-65468 | 4/1984 | Japan . |
| 1-276497 | 11/1989 | Japan . |
| 4-209395 | 7/1992 | Japan . |
| 4-212788 | 8/1992 | Japan . |
| 6-187788 | 7/1994 | Japan . |

*Primary Examiner*—A. Zarabian
*Attorney, Agent, or Firm*—Loeb & Loeb LLP

[57] ABSTRACT

A semiconductor memory device that steps up word lines, each of whose length is short enough to stay within one of the blocks that is formed by dividing a memory cell array into multiple blocks. The device includes multiple memory cells connected to pairs of bit lines and word lines at intersections of the pairs of bit lines and the word lines. Multiple memory cell array blocks are formed by dividing the region where the memory cells are arranged into blocks. A first step-up line is commonly used in stepping-up the word lines. A step-up circuit is constructed of a step-up capacitor, which is connected to the first step-up line and a switching transistor, which precharges the step-up capacitor. The semiconductor memory device also has a step-up control circuit that outputs a precharge control signal, which precharges the step-up capacitor by ON driving the switching transistor, and a step-up driving signal, which changes the potential of the negative terminal of the step-up capacitor of the step-up circuit. Further, a second step-up line is provided in each memory cell array block. During operation, a single memory cell array block is selected by a block selective circuit and a single word line is selected by row selective circuits. In this manner, the single selected word line within the single selected memory cell array block is stepped up by means of the first and second step-up lines.

41 Claims, 11 Drawing Sheets

SEMICONDUCTOR MEMORY DEVICE AND A METHOD FOR STEPPING UP ITS WORD LINES

FIELD OF THE INVENTION

The present invention pertains to a semiconductor memory device such as a static random access memory ("RAM"); and, in particular, to a semiconductor memory device which widens the amplitude of data stored in memory cells by stepping up its word lines and an improved method for stepping up the word lines.

BACKGROUND OF THE INVENTION

In a semiconductor memory device, the data stored in memory cells may be incidentally destroyed by alpha rays, noise, or the like. This type of data destruction occurs more often when the amplitude of the data stored in the memory cells (i.e., the difference between the voltage of H level and L level) is decreased. Therefore, the influence of such data destruction is more important now that low voltage semiconductor memory devices are in greater demand.

Accordingly, Japanese Patent Laid-open Application Showa 58-169958 discloses a device in which the amplitude of the data in memory cells is widened as much as possible within the limit of a given power voltage. This conventional device will now be described with reference to FIGS. 1 and 2. FIG. 1 shows a step-up circuit for a conventional static RAM. As shown, a memory cell 10 is composed of four N-channel MOSFETs ("NMOS transistors") T20–T23 and two high resistance loads R1 and R2. Multiple memory cells 10 are arranged in matrix form and each memory cell 10 is connected to a word line WL and a pair of bit lines BL and /BL (a bar of BL). Each word line WL is long enough to be connected to 256 memory cells, and there are 512 word lines, for example. The pair of bit lines BL and /BL are used to write data in or read data out of the memory cells 10, and there are 1024 pairs of bit lines BL and /BL, for example.

Data buses DB and /DB are coupled to the pair of bit lines by means of a column gate 12, which is composed of four transistors T14–T17 controlled by row selective signals Y and /Y. Bit line load transistors T18 and T19 are connected between a power source (not shown) and the bit lines BL and /BL, respectively. A write-in circuit 14 is composed of two P-channel MOSFETs ("PMOS transistors") and two NMOS transistors T10–T13. An inverter composed of PMOS transistor T8 and NMOS transistor T9 functions as a word line driver 16, and there are as many word line drivers as the number of word lines WL. The word line driver 16 is driven by the output of a row selective decoder 18.

Further, a step-up control circuit 20 is composed of three PMOS transistors T1, T3, and T4, three NMOS transistors T2, T5, and T6, and a delay circuit 22. Additionally, a step-up circuit 24 is composed of a step-up capacitor C1 and a PMOS transistor T7.

Next, the operation of the conventional device will be described with reference to the timing chart of FIG. 2. In the device of FIG. 1, when data is written in the memory cell 10, the write-in signals IN and /IN are illustratively input to the write-in circuit 14, which is composed of four transistors T10–T14, so that the write-in signals IN and /IN go to logic L and H, respectively, at a time when the write enable signal /WE is set to a low level. In this case, the data bus /DB is raised up to the voltage of power source line Vdd when the write enable signal goes to logic L, as shown in FIG. 2. Further, the bit line /BL is also raised up to nearly Vdd, because the PMOS transistors and NMOS transistors that form the column gate 12 are connected in parallel and the bit line load transistor is a PMOS transistor.

Additionally, the write enable signal /WE is input to the step-up control circuit 20 and inverted to the write enable signal WE by means of transistors T1 and T2, which form an inverter. The write enable signal WE is supplied to the gates of the transistors T4 and T5. The write enable signal /WE is also delayed by the delay circuit 22 for a predetermined period to form the signal /WEd, which is supplied to the gates of transistors T3 and T6. The transistors T3–T6 form a NOR gate, so that node D goes to logic H only when both signals /WE and /WEd are at logic L. The transistor T7 turns on when node D is at logic L to charge the step-up capacitor C1 to the power source voltage Vdd. Therefore, when node D goes to logic H, the transistor T7 turns off, and the sum of the voltage of node D and the charged voltage of the step-up capacitor C1, (i.e., an electrical potential which is equal to or higher than the power source voltage Vdd) is supplied to the word line driver 16. In this manner, the electrical potential X of the word line WL is temporarily raised to a voltage level equal to or higher than Vdd after the write-in has been completed. Thus, the voltage of node B in the memory cell 10 is drastically raised to Vdd after the write-in has been completed.

In the above-described conventional device, the step-up circuit 24 must step-up the potential of the step-up lines having a very large capacitance, because the step-up signals are directly supplied to the positive power source terminal of the word line driver 16 to step-up the corresponding word line WL. Therefore, the scale of the step-up circuit 24 must be very large, and thus, there is an increase in the layout area and power consumption of the device.

Additionally, in the conventional device, the step-up pulse is generated on detection of the rising edge of the write enable signal /WE (i.e., at the end of writing). Therefore, there is a drawback in that the step-up operation is not performed when the write enable signal /WE is fixed in the state of logic L (i.e., when the address signals and input data vary in the write cycle).

Moreover, in the conventional device, the step-up of the word lines is performed after write-in is completed (i.e., after the write enable write enable signal /WE goes to logic H from logic L). Due to this, there is another drawback in that the precharge and equalizing operation of the pair of bit lines cannot be performed immediately after the write-in, so it takes a very long time to transfer from a write cycle to a read cycle.

To reduce the capacitance of the step-up lines, the device disclosed in Japanese Patent Laid-open Application Heisei 4-212788 (by this applicant) has been proposed. In this device, the word lines are divided into multiple blocks in the direction of the word lines, and the region where the memory cells are positioned is divided into blocks corresponding to the divided word lines. This forms the multiple memory cell array blocks used in the device, as shown in FIG. 21 of the Official Gazette. Also, the step-up circuits, which are shown in FIG. 5 of the Official Gazette, are positioned in each of the blocks, and the step-up operation is performed in every block by one of the step-up circuits based on the block selective signals.

However, in the device of Japanese Patent Laid-open Application Heisei 4-212788, as many step-up circuits (including step-up capacitors) are required as the number of blocks, so there is an increase in the layout area for the step-up circuits as a whole.

Further, Japanese Publication Application Showa 62-28516 and 62-28517 also discloses semiconductor memory devices in which the region for arranging the memory cells is divided into blocks. However, there is no disclosure with respect to the step-up operation.

SUMMARY OF THE INVENTION

Therefore, the object of the present invention is to provide a semiconductor memory device and a method for stepping up its word lines in which reduced power consumption is achieved by reducing the capacitance of the step-up lines and miniaturization is realized by reducing the layout area of the step-up circuits.

Another object of the present invention is to provide a semiconductor memory device and a method for stepping up its word lines in which reduced power consumption is achieved and miniaturization is possible without the occurrence of data destruction, even when the allowable margin of the power voltage is large.

Yet another object of the present invention is to provide a semiconductor memory device that prevents errors due to insufficient precharge, by beginning the step-up operation immediately after the precharge of the step-up capacitor is completed.

Still another object of the present invention is to provide a semiconductor memory device that requires less time to transfer from a write cycle to a read cycle while reducing the occurrence of data destruction.

Another object of the present invention is to provide a semiconductor memory device that properly steps up the word lines at the time of changing the row address and/or changing the data and/or transferring between a write cycle and a read cycle.

To achieve these objects and remove the drawbacks of conventional devices, a first preferred embodiment of the present invention provides a semiconductor memory device having: multiple static memory cells connected to a pair of bit lines of multiple columns and word lines of multiple rows, at intersections of the bit lines and the word lines; multiple memory cell array blocks formed by dividing multiple regions where the memory cells are positioned into blocks corresponding to the word lines divided into multiple blocks in the direction of the word lines; a first step-up line commonly used for stepping up all the word lines within the multiple memory cell array blocks; a step-up capacitor with a positive terminal connected to the first step-up line; a switching means connected between a power source line and the positive terminal of the step-up capacitor; a step-up control means which outputs precharge control signals that precharge the step-up capacitor by ON driving the switching means and step-up driving signals that vary the electrical potential of a negative terminal of the step-up capacitor; a second step-up line positioned corresponding to each of the memory cell array blocks; a block selective circuit positioned corresponding to each of the memory cell array blocks, which selects a single memory cell array block based on block address signals; and a row selective circuit positioned corresponding to each of the memory cell array blocks, which selects a single word line based on row address signals, wherein the single word line selected by the row selective circuit within the single memory cell array block selected by the block selective circuit is stepped up by way of the first and second step-up lines.

According to the first preferred embodiment of the present invention, one of the memory cell array blocks is selected and the word line that is stepped up has a length that is short enough as to stay within the selected block. Therefore, the load capacitance at stepping up is only equal to the wiring capacitance of the word lines within the selected block and the first and second step up lines. This enables efficient step-up and prevents an increase in current consumption. Further, only a small capacitance step-up capacitor is required because the total wiring capacitance step-up lines is smaller. Moreover, the step-up capacitor can be commonly used by the multiple memory cell array blocks, so one does not have to be provided in every block. Hence, the layout area for the step-up circuit (including the step-up capacitor) is reduced. Further, by performing the step-up operation properly, less data destruction occurs even at a low power source voltage, and thus a wide margin for the power source voltage is allowed.

A second preferred embodiment of the present invention provides a semiconductor memory device having: multiple static memory cells connected to a pair of bit lines of multiple columns and N×n sub word lines, at intersections of the bit lines and the word lines; multiple memory cell array blocks formed by dividing multiple regions where the memory cells are positioned into blocks corresponding to the sub word lines divided into multiple blocks in the direction of the sub word lines; N main word lines positioned over the multiple memory cell array blocks, which make the n sub word lines selective by activating any one of the N main word lines; a first step-up line commonly used for stepping up all the sub word lines within the multiple memory cell array blocks; a step-up capacitor with a positive terminal connected to the first step-up line; a switching means connected between a power source line and the positive terminal of the step-up capacitor; a step-up control means which outputs precharge control signals that precharge the step-up capacitor by ON driving the switching means and step-up driving signals that vary the electrical potential of a negative terminal of the step-up capacitor; a second step-up line positioned n lines for each of the memory cell array blocks; a block selective circuit positioned corresponding to each of the memory cell array blocks, which selects a single memory cell array block based on block address signals; a sub row selective circuit positioned corresponding to each of the memory cell array blocks, which selects one out of n sub word lines based on sub row address signals; and a main row address circuit commonly used for the multiple memory cell array blocks, which selects a single main word line based on main row address signals, wherein the single sub word line selected by the sub row selective circuit out of the n sub word lines which correspond to the single main word line selected by the main row selective circuit is stepped up by way of the first and second step-up lines in the block selected by means of the block selective circuit.

In the second preferred embodiment, efficient step-up is performed because the load capacitance at stepping-up is only the sum of the wiring capacitance of the sub word line within the selected block and the first and second step-up lines, the layout area of the step-up circuit (including the step-up capacitor) is reduced, and an increase in current consumption is minimized, as in the first preferred embodiment.

In the second preferred embodiment, transfer gates can be provided between each of the n second step-up lines and each of the n sub word lines. One of the control terminals of each transfer gate is connected to a main word line and the other one is connected to the main word line by means of an inverter. This provides an easy circuit configuration for connecting the second step-up line and the sub word line, so the layout area is reduced. Thus, high density integration can be achieved.

In the present invention, it is preferable that the step-up control means steps up a selected word line by way of the first and second step-up lines, by raising the potential of the negative terminal of the step-up capacitor by changing the step-up driving signals after completing the precharge by turning off the switching means by changing the pre-charge control signals. This prevents errors and improper operation due to an insufficient potential level on the word lines or sub word lines, by performing the step-up operation after the level of the word lines or sub word lines reaches the power source voltage.

In the present invention, it is also preferable that the step-up control means starts precharge of the step-up capacitor by turning on the switching means by changing the precharge control signals after completing the step-up of the single selected word line by lowering the potential of the negative terminal of the step-up capacitor by changing the step-up driving signals. This prevents a drop in the voltage of the first and second step-up lines, and the selected word lines or sub word lines.

Additionally, in the present invention, it is preferable that an address transition detecting means be provided to detect changes in the row address signals. The step-up control means can then change the precharge control signals and the step-up driving signals based on the detection signals from the address transition detecting means. In such a manner, the word lines or sub word lines can be stepped up every time the row address changes, so there is less data destruction even when the write cycle continues successively.

Further, in the present invention, it is preferable that a data transition detecting means be provided to detect changes in the data written to the memory cells. The step-up control means can then change the precharge control signals and the step-up driving signals based on the detection signals from the data transition detecting means. In such a manner, the word lines or sub word lines can be stepped up every time the data changes, so there is less data destruction even when the write cycle continues successively.

In the present invention, it is also preferable that a write enable signal transition detecting means be provided to detect changes in the write enable signals. The step-up control means can then change the precharge control signals and the step-up driving signals based on the detection signals from the write enable signal transition detecting means. Thus, the step-up control means can also step-up the word lines or sub word lines by changing the step-up driving signals only in the write cycle based on the write enable signals. In such a manner, the step-up operation is not performed in the read cycle in which data destruction is less common, and thus reduced power consumption can be achieved.

On the other hand, the step-up control means can step-up the word lines or sub word lines in both the write cycle and the read cycle based on the detection of both the leading edge and trailing edge of the write enable signal in the write enable signal transition detecting means.

Further yet, in the present invention, it is preferable that the step-up control means performs the step-up operations only when the power is on, based on an auto power-down signal used for activating the word line or main word line and sub word line for a certain period of power-on. This enables a further reduction in the current consumption because the step-up operation is completed by auto power down.

Also, in the present invention, it is preferable that the step-up control means includes a step-up/non step-up switching circuit that lowers the electrical potential of the negative terminal of the step-up capacitor by the step-up driving signal to inactivate step-up operations of the sub word line when the power voltage exceeds a predetermined voltage. In the alternative, it is preferable that the step-up control means includes a control means which controls the amplitude of the voltage of the step-up driving signal when the power voltage is over a predetermined voltage. This prevents the word lines or the sub word lines from excessive step-up, and thus lowers power consumption.

The present invention also provides a preferred method of stepping-up a word line in a semiconductor memory device of the type having multiple static memory cells connected to a pair of bit lines of multiple columns and word lines of multiple rows, at intersections of the bit lines and the word lines, the method comprising the steps of: stepping up the single word line before data is written to or read from the memory cells; providing multiple memory cell array blocks which are formed by dividing multiple regions where the memory cells are positioned into blocks corresponding to the word lines divided into multiple blocks in the direction of the word lines; providing a step-up capacitor that is used by the multiple memory cell array blocks; precharging the step-up capacitor by applying the power source voltage on its positive terminal; supplying the power source voltage to the single selected word line within a single selected memory cell array block based on a block address signal that selects one of the multiple memory cell array blocks and a row address signal that selects one of the multiple word lines; and stepping up the single word line by changing the potential of the negative terminal of the step-up capacitor after a predetermined period.

In this method of the present invention, efficient step-up is performed so an increase in current consumption is minimized because only a small load capacitance is presented for the step-up operation. Further, the capacitance of the step-up capacitor can be made small and the step-up capacitor can be commonly used by the multiple memory cell array blocks, because the total wiring capacitance of the step-up lines is small. This enables a reduction in the layout area of the step-up circuit (including the step-up capacitor). Further, performing the step-up operations every time reduces the occurrence of data destruction and secures an adequate margin for the power source voltage, even at a low power source voltage. Moreover, errors and improper operation due to an insufficient potential on the word lines can be prevented by stepping up the word lines after their level has reached the power source voltage. The data destruction within a memory cell can be prevented by performing the step-up operation after the load on the bit lines is completely discharged when the power source voltage is supplied to the word line after the completion of the precharge operation.

Other objects, features, and advantages of the present invention will become apparent from the following detailed description. It should be understood, however, that the detailed description and specific examples, while indicating preferred embodiments of the invention, are given by way of illustration only and various modifications may naturally be performed without deviating from the scope of the present invention.

DETAILED DESCRIPTION OF PREFERRED EMBODIMENTS

Using specific examples of the present invention, the contents of the present invention will be described in more detail below with reference to the attached drawings.

Embodiment 1

Figure 3:
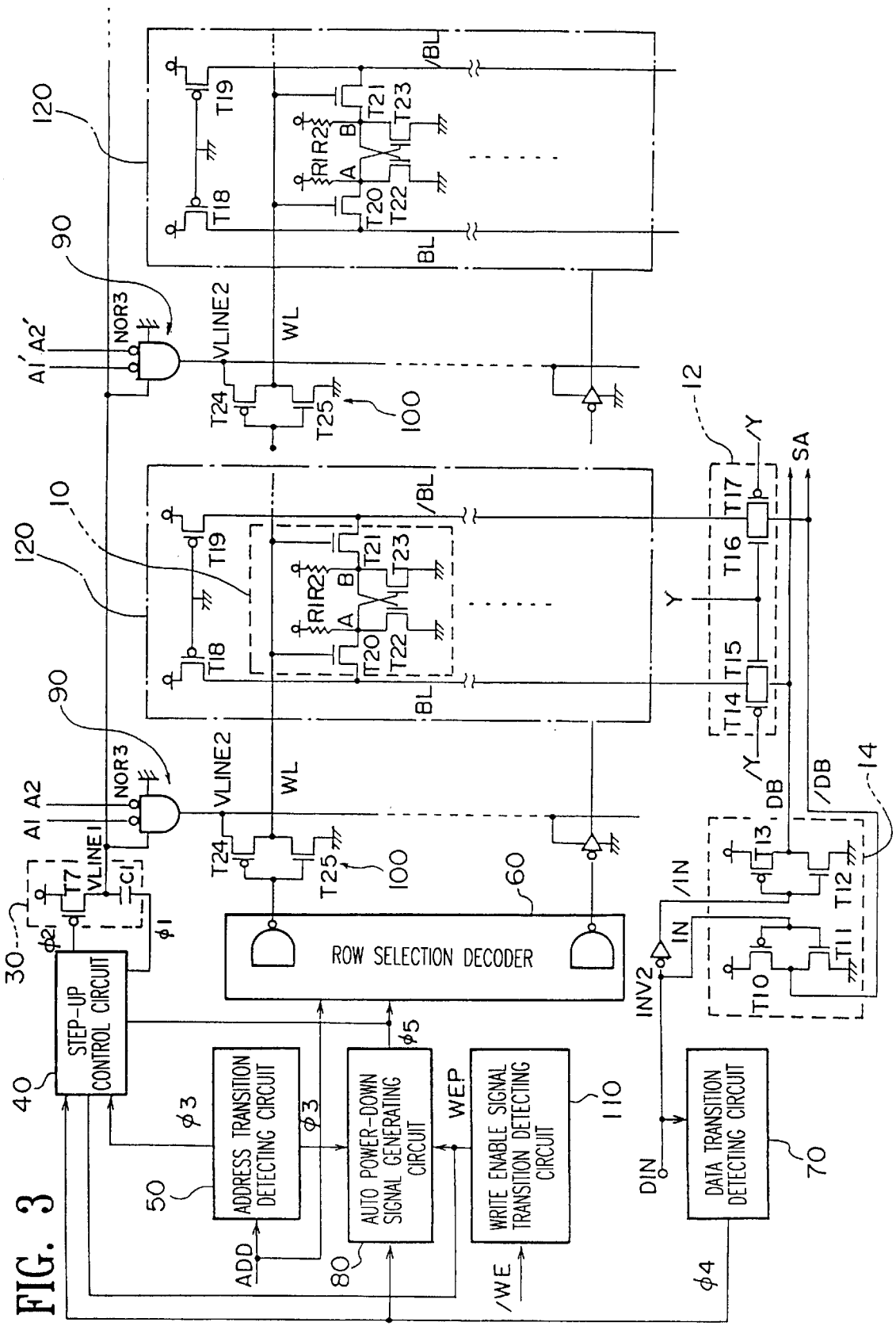
FIG. 3 is an overall configuration of a semiconductor memory device according to a first embodiment of the present invention.
Figure 4:
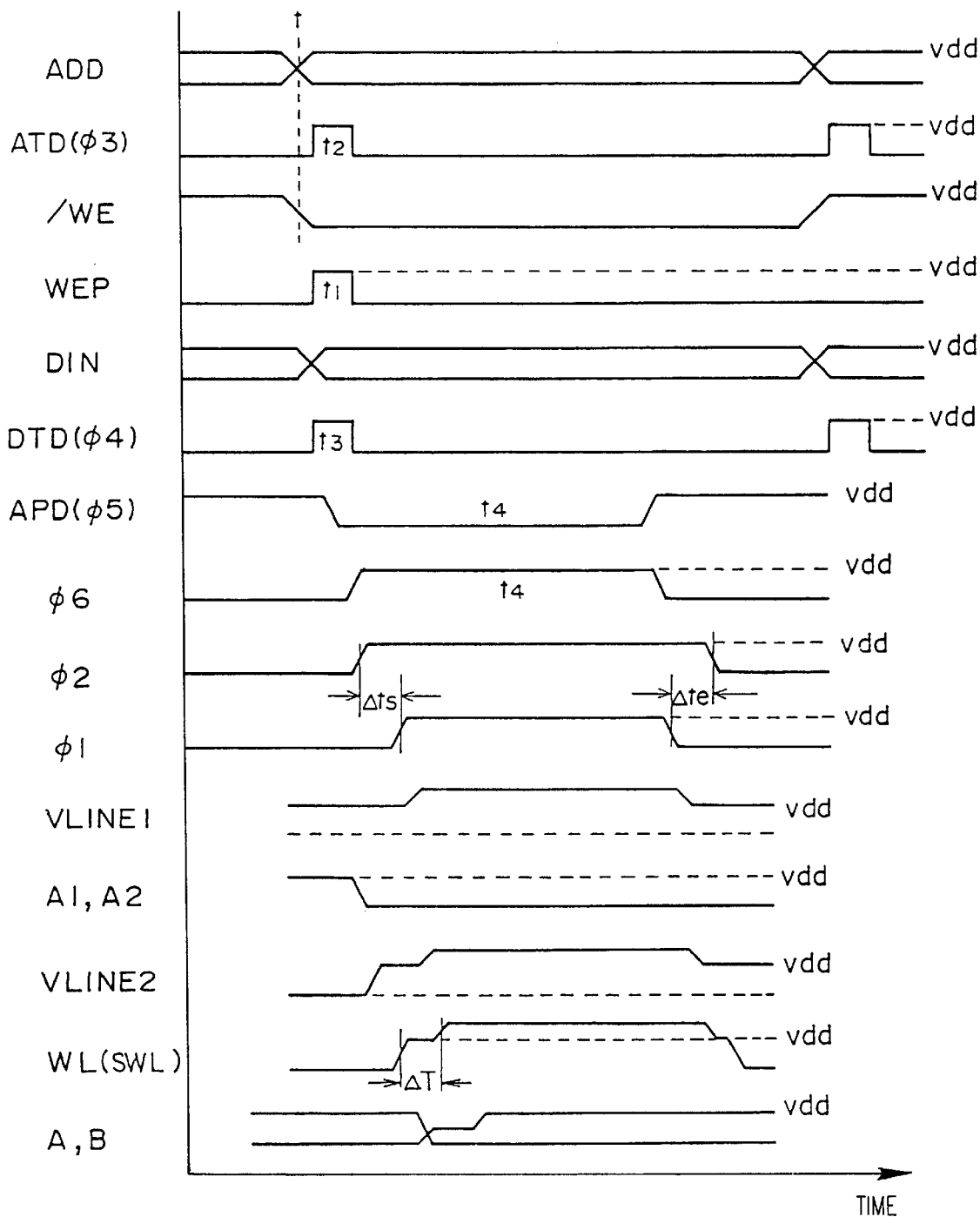
FIG. 4 is a timing chart illustrating the operation of the first embodiment as shown in FIG. 3.
Figure 5:
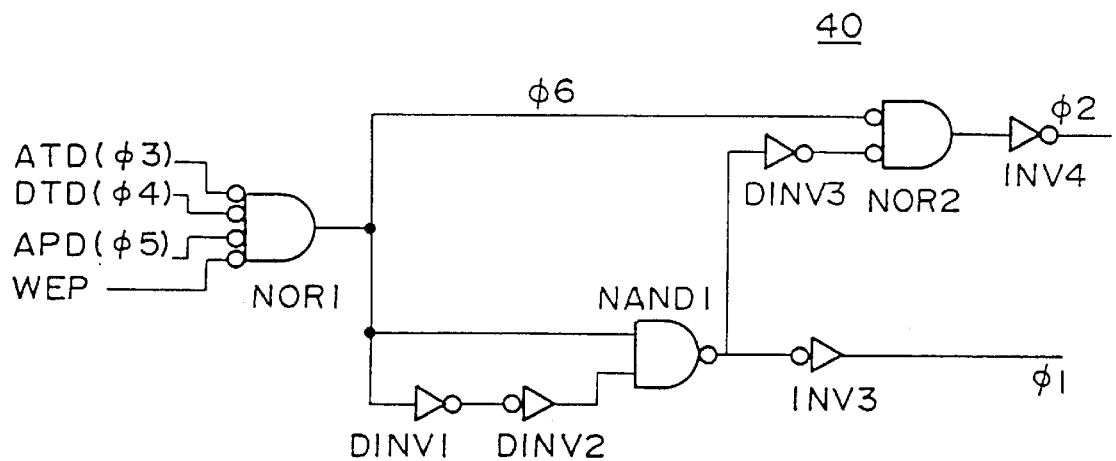
FIG. 5 is a circuit diagram showing a preferred embodiment of the step-up control circuit of FIG. 3.

A first embodiment of the present invention will now be described with reference to FIGS. 3–7. FIG. 3 shows the overall configuration of a semiconductor memory device according to the first embodiment of the present invention, FIG. 4 is a timing chart illustrating the operation of the first embodiment, and FIG. 5 shows a preferred embodiment of the step-up control circuit of FIG. 3.

Figure 1:
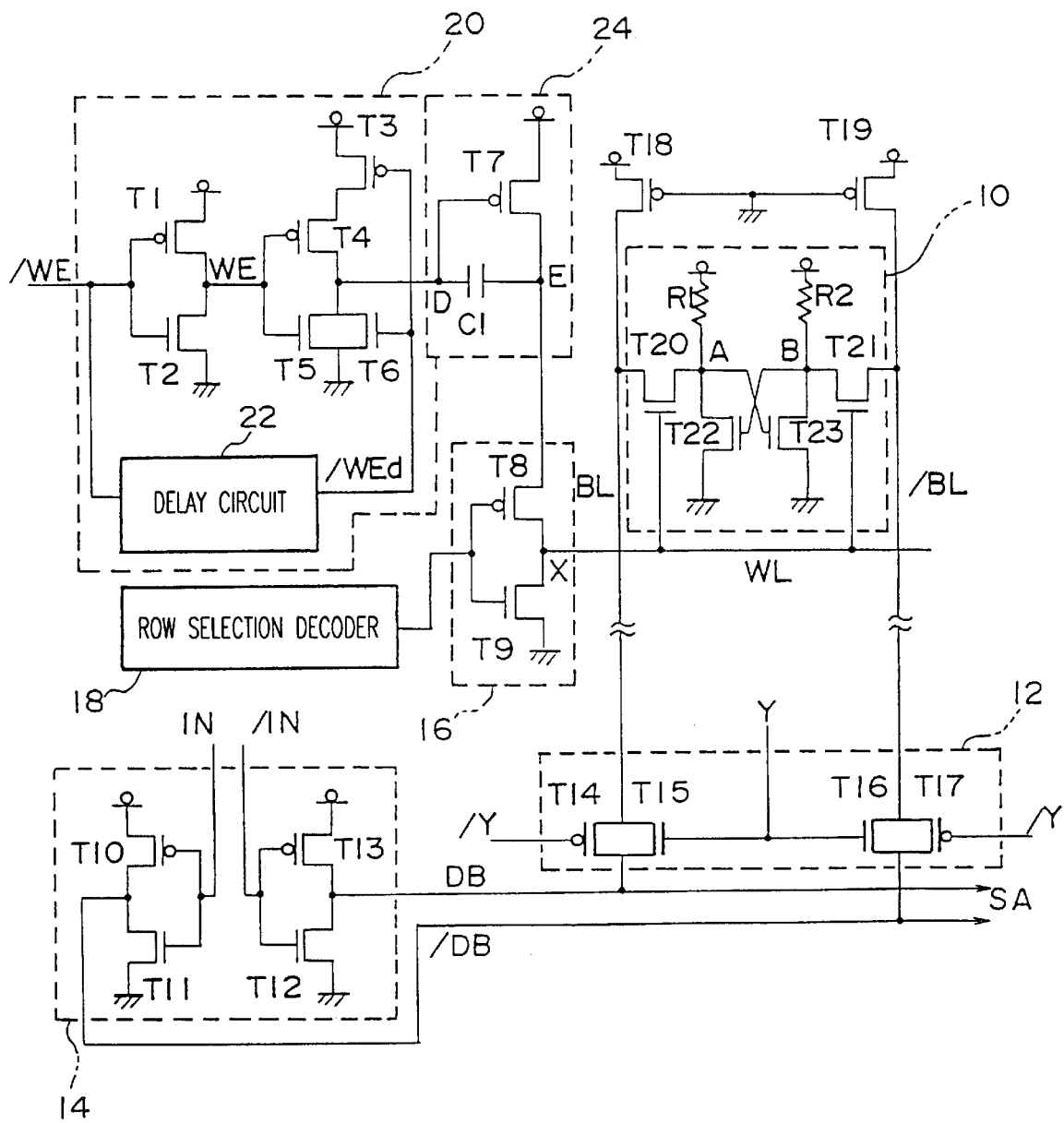
FIG. 1 is an overall configuration showing a step-up circuit of a conventional semiconductor memory device.
Figure 2:
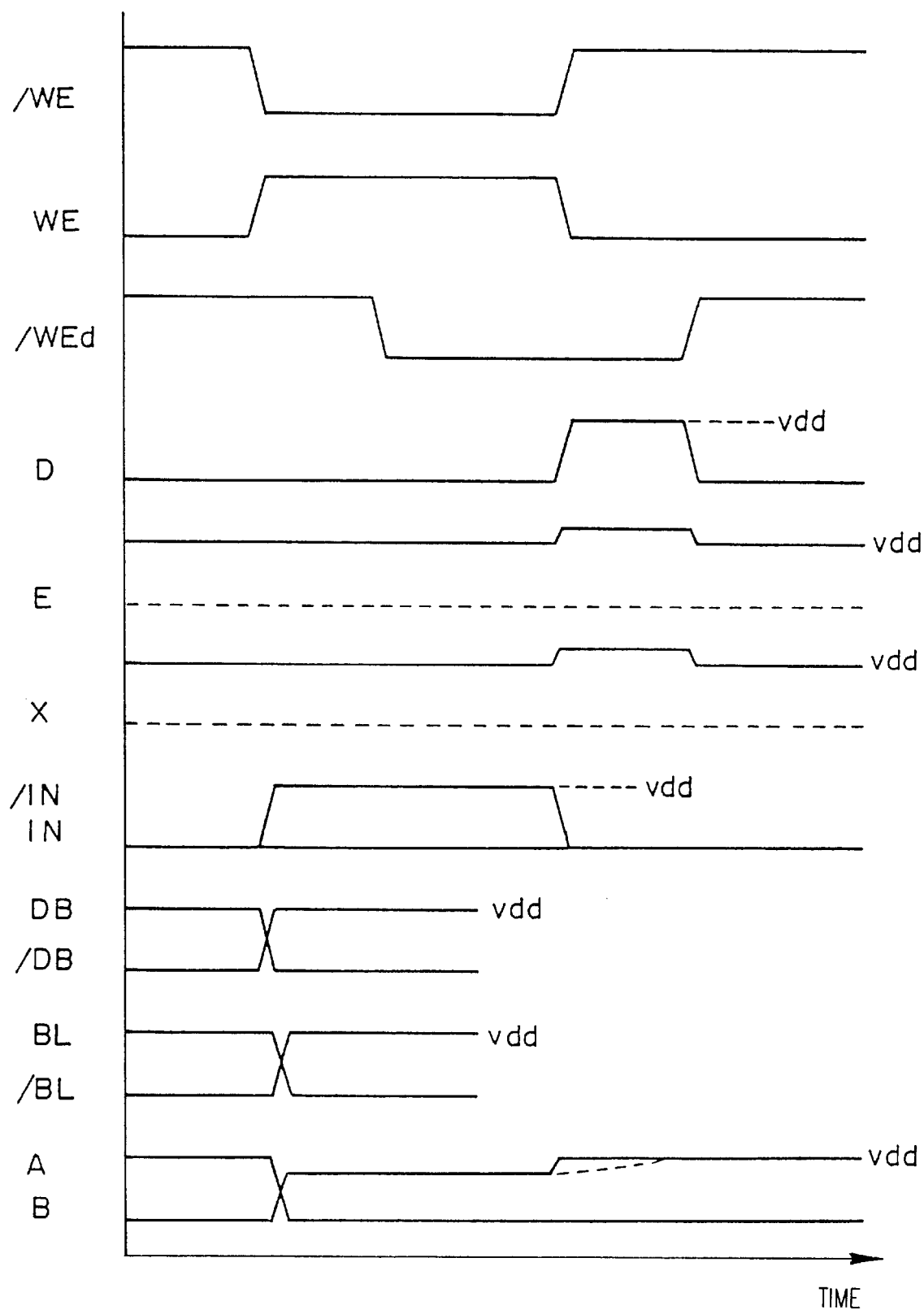
FIG. 2 is a timing chart illustrating the operation of the conventional device of FIG. 1.

As shown in FIG. 3, the memory cell 10, the column gate 12, and the write-in circuit 14 have the same configuration as in the device of FIG. 1. However, in the first embodiment of the present invention, multiple memory cell array blocks 120 are formed by dividing the region where the memory cells 10 are arranged into multiple blocks in the direction of the word line WL. As a result, the length of each word line is equal to or shorter than the length of a single memory cell array block 120. Every block 120 is provided with a block selective decoder 90, which selects a single block, and a word line driver 100, which activates a word line within a selected block.

A step-up circuit 30, a step-up control circuit 40, an address transition detecting circuit 50, a row selective decoder 60, a data transition detecting circuit 70, an auto power-down signal generating circuit 80, and a write enable signal transition detecting circuit 110 are provided in addition to the above-mentioned column gate 12 and write-in circuit 14 to be commonly used by all of the block.

The step-up circuit 30 is constructed of a step-up capacitor C1 and a precharge PMOS transistor T7. The PMOS transistor T7 is a switching means connected between the power source line and the positive terminal of the step-up capacitor C1. The precharge control signal $\phi 2$ from the step-up control circuit 40 is supplied to the gate of the PMOS transistor T7 to turn on/off the PMOS transistor T7. When the PMOS transistor T7 is turned on, the step-up capacitor C1 is precharged. Additionally, the step-up driving signal $\phi 1$ from the step-up control circuit 40 is supplied to the negative terminal of the step-up capacitor C1. When the potential of the step-up driving signal $\phi 1$ is low, the step-up capacitor C1 is pre-charged, and when the step-up driving signal $\phi 1$ is at the power source voltage, the step-up line connected to the positive terminal is stepped up.

First, the signals input to the step-up control circuit 40 that controls the step-up circuit 30 will be described.

A row address signal ADD is input to the address transition detecting circuit 50 and the row selective decoder 60. The address transition detecting circuit 50 generates a pulse when a change in the row address signal ADD is detected. In particular, it generates the pulse signal $\phi 3$ at logic H only when the row address signal ADD changes. The pulse signal $\phi 3$ is input to the step-up control circuit 40.

Additionally, external write-in data IN is input to the data input terminal DIN. The data IN is inverted by an inverter INV2 to generate an inverted data signal /IN. These data signals IN and /IN are input to the write-in circuit 14. The data transition detecting circuit 70, which detects changes in the input data IN and generate pulses when a change is detected, generates the pulse signal $\phi 4$. The pulse signal $\phi 4$ is also input to the step-up control circuit 40. The write enable signal transition detecting circuit 110 detects a falling edge of the write enable signal /WE and outputs a pulse WEP to the step-up control circuit 40 and the auto power-down signal generating circuit 80 when a falling edge is detected.

The auto power-down signal generating circuit 80 generates an auto power-down signal $\phi 5$ using a timer circuit (not shown) in response to the pulse signals $\phi 3$ and $\phi 4$, and the pulse WEP. When the auto power-down signal $\phi 5$ is at the L level, the device of the first embodiment operates. The auto power-down signal $\phi 5$ is input to the row selective decoder 60, which selects a memory cell in the row direction, and the step-up control circuit 40.

The step-up control circuit 40 receives the four pulses $\phi 3$, $\phi 4$, $\phi 5$, and WEP, and generates both the step-up driving signal $\phi 1$ that is supplied to the step-up capacitor C1 and the precharge control signal $\phi 2$ that controls the precharge PMOS transistor T7 based on the four pulses.

FIG. 5 shows a preferred embodiment of the step-up control circuit 40 of FIG. 3. The four pulses $\phi 3$, $\phi 4$, $\phi 5$, and WEP are input to a first NOR gate NOR1, and the output thereof is supplied to a first delay inverter DINV1, a first NAND gate NAND1, and a second NOR gate NOR2. The output from the first delay inverter DINV1 is supplied to the first NAND gate NAND1 by means of a second delay inverter DINV2. The output from the first NAND gate NAND1 is supplied to both the second NOR gate NOR2 by means of a third delay inverter DINV3 and an inverter INV3. The output of the second NOR gate NOR2 is supplied to another inverter INV4. The control signals $\phi 1$ and $\phi 2$ are respectively output from the inverters INV3 and INV4. As explained above, the control signal $\phi 2$ is a precharge control signal that controls the precharge PMOS transistor T7, and the control signal $\phi 1$ is a set-up driving signal supplied to the negative terminal of the step-up capacitor C1. In a preferred embodiment, the step-up capacitor C1 is formed by NMOS transistors.

The block selective decoder 90 is constructed of a NOR gate NOR3 that receives decode signals A1 and A2 for block selection. The block selective decoder 90 selects a single block from the multiple memory cell array blocks 120. More specifically, the positive power supply terminal of the NOR gate NOR3 is connected to a first step-up line VLINE1, which is stepped up by the step-up capacitor C1, and the negative power supply terminal of the NOR gate NOR3 is connected to ground. As shown, the first step-up line VLINE1 is commonly used by all of the memory cell array blocks 120. The output from the NOR gate NOR3 is connected to the positive power supply terminal of an inverter which is constructed by a PMOS transistor T24 and an NMOS transistor T25. This inverter functions as the word line driver 100, and has its output terminal connected to a word line WL.

In the first embodiment, the load capacitance connected to the step-up capacitor C1 is the total of the load capacitance of the first step-up line VLINE1 and the second step-up line VLINE2, which are the power source line and the output line of the block selective decoder 90, respectively, and the load capacitance of a single word line WL within a selected block. Therefore, there is a small load capacitance at step-up, so efficient step-up is obtained and an increase in current consumption is prevented, as compared with the conventional device in which a long word line that is not divided into blocks is stepped up. Further, the small load capacitance allows the capacitance of the step-up capacitor C1 to be made smaller, so the layout area is reduced. Additionally, as compared with the conventional device in which the word lines are divided, the layout area is smaller because the step-up capacitor C1 is commonly used by multiple blocks.

Next, the operation of the first embodiment will be described with reference to FIGS. 3 and 4. The row address signal ADD is input to the address transition detecting circuit 50 and the row selective decoder 60, and the row address is input to the row selective decoder (not shown). A case in which both the row address signal ADD and the write-in data IN change in the write-in cycle will be described by way of example. The write enable signal /WE changes from logic H to L at time t. Detecting this change, the write enable signal transition detecting circuit 110 generates a pulse WEP of logic H for a predetermined period t1. Additionally, the row address signal ADD changes, and detecting this change, the address transition detecting circuit 50 generates a pulse signal φ3 of logic H for a predetermined period t2. Further, the input data IN changes, so the data transition detecting circuit 70 detects the change and generates a pulse signal φ4 of logic H for a predetermined period t3.

The auto power-down signal generation circuit 80 receives the pulse signals φ3 and φ4 and generates the signal φ5 at logic L for a predetermined period t4. Then, the WEP signal and pulse signals φ3, φ4, and φ5 are input to the first NOR gate NOR1 in the step-up control circuit 40, so the pulse φ6 is generated at logic H for the period t4.

Next, the step-up driving signal φ1, which controls the step-up capacitor C1, and the precharge control signal φ2, which controls the precharge transistor T7, are generated from the signal φ6 in the pulse generation circuit using the delay inverters DINV1–DINV3, the inverters INV2 and INV3, the NAND gate NAND1, and the second NOR gate NOR2.

More specifically, when the precharge control signal φ2 is in the precharge state of logic L, the step-up capacitor C1 is charged so that there appears a potential difference equal to the power source voltage Vdd. Then the signal φ2 changes to logic H to turn off the precharge transistor T7 and complete the precharge. Next, after a period Δts, the step-up driving signal φ1 rises from logic L to H to start the step-up operation. During this step-up operation, the voltage on the power source line VLINE1 of the block selective decoder 90 is raised to the level of the power source voltage Vdd+ΔV, because the charge voltage of the step-up capacitor C1 is added to the power source voltage. At this moment, the block selective signals A1 and A2 have already been input to the NOR gate NOR3 of the block selective decoder 90 so line VLINE2, which is the output of the NOR gate NOR3, is already at the power source voltage Vdd. Then, the level of the second step-up line VLINE2 rises to Vdd+ΔV (i.e., to almost the same level as the first step-up line VLINE1) in response to the voltage level Vdd+ΔV of the first step-up line VLINE1.

Further, the second step-up line VLINE2 is connected to the positive power supply terminal of the word line driver 100, which is constructed of transistors T24 and T25. At this moment, the word line selective signal, which is the output of the row selective decoder 60, is already at logic L and the output of the word line driver 100, which is already at logic H (or Vdd level), is raised up to Vdd+ΔV in response to the level of the second step-up line VLINE2.

Meanwhile, the write-in data is input from the data input terminal DIN and transmitted to the data bus DB by means of the write-in buffer constructed of the PMOS transistor T10 and the NMOS transistor T11. The data signal is also inverted by inverter INV2 and transmitted to the data bus DB by means of the write-in buffer constructed of transistors T12 and T13.

Further, the row selective signals Y and /Y, which are output by the row selective decoder (not shown) are at logic of H and L, respectively. Thus, the transistors which construct the column gate 12 are turned on, and the data from the data bus DB and/DB is transmitted to the bit lines BL and /BL.

At this moment, the selected word line WL is stepped up to Vdd+ΔV as described above, and the store node B of the memory cell 10 is raised to about Vdd+ΔV−Vth. (Vth is the threshold voltage of the transistors T20 and T21 which construct the transfer gate of the memory cell 10.) Accordingly, the stepped up voltage ΔV must be at least equal to the threshold voltage Vth of the transistors T20 and T21 in order to raise node B to the power source voltage Vdd.

After the period t4, the auto power-down signal φ5 changes from logic L to H. In response to this, the output signal φ6 of the first NOR gate NOR1 changes to logic L. This causes the step-up driving signal φ1 to change to logic L to complete the step-up operation, and the precharge control signal φ2 to change to logic L to precharge the step-up capacitor C1 and the first step-up line VLINE1 to the potential Vdd, a period of Δte after the step-up driving signal φ1 changes to logic L. Because the auto power-down signal φ5 is input to the row selective decoder 60, the level of the word line WL goes to logic L in response to the change of the signal φ5 to logic H. Thus, the write-in to the memory cell 10 is completed.

In the first embodiment, because the step-up operation is performed in the write cycle, the bit lines can be precharged and equalized immediately after the completion of write-in. Therefore, the time required to transfer from a write cycle to a read cycle is reduced. Further, current consumption is reduced because the step-up operation is completed by auto power-down. In addition, the store node potential of the memory cell 10 at data write-in is set higher because the word lines are stepped up, and thus the low voltage characteristics of the device are improved.

Now, the timing of the step-up driving signal φ1 and the precharge control signal φ2 will be described in detail. As explained above, the step-up driving signal φ1 changes to logic H a period Δts after the precharge control signal φ2 has changed to logic H. In other words, the timing at which the step-up operation is performed is delayed after the precharge is completed. By performing the step-up operation after the level of the word line WL reaches the power source voltage Vdd, errors and improper operation caused by an insufficient potential level of the word line WL are minimized. Further, the precharge control signal φ2 changes to logic L a period Δte after the step-up driving signal φ1 has changed to logic L. In other words, the timing at which the precharge is started is delayed by a period from the completion of the step-up operation. Therefore, voltage depression in the first and second step-up lines VLINE1 and VLINE2 and the selected word line WL is prevented.

Moreover, in the first embodiment, only a single word line W (selected by the row address signal ADD) within a single memory cell array block 200 (selected by the block address signals A1 and A2) is stepped up. Accordingly, the load capacitance of the step-up lines is very small and power consumption is reduced. Further, the layout area is reduced because a single step-up capacitor C1 is used by the multiple blocks 200.

In the above-described embodiment, the step-up operation is described for a case in which the write enable signal /WE, the address signal ADD, and the write-in data IN change simultaneously. The step-up operation is also performed in the following cases. The step-up operation is performed in the case in which only the address signal ADD changes, while the write enable signal /WE stays at logic L. Similarly, it is performed when only the write-in data IN changes while the write enable signal /WE stays at logic L. Further, it is performed when both the address signal ADD and the write-in data DIN change. In the first embodiment, because the pulse φ3 generated to detect changes in the address signal and the pulse φ4 generated to detect changes in the write-in data IN are input to the first NOR gate NOR1 of FIG. 5, the step-up operation is performed in any of the above cases.

The above description explains the step-up operations in the write cycle. In the read cycle, step-up operations are performed in the same way as in write cycle because the pulse φ3 is generated when any change in the address signal ADD is detected. However, there is a possibility that the address signal ADD will not change on the transition from a write cycle to a read cycle. In such a case, the step-up operation is performed in the read cycle if the WEP signal is also generated by the pulse generation circuit 110 of FIG. 3 on detection of a rising edge of the /WE signal, which is input to the auto power-down signal generating circuit 80. In a read cycle, only a single word line W (selected by the row address signal ADD) within a single memory cell array block 200 (selected by the block address signals A1 and A2) is stepped up, in the same manner as in the write cycle.

Embodiment 2

Figure 6:
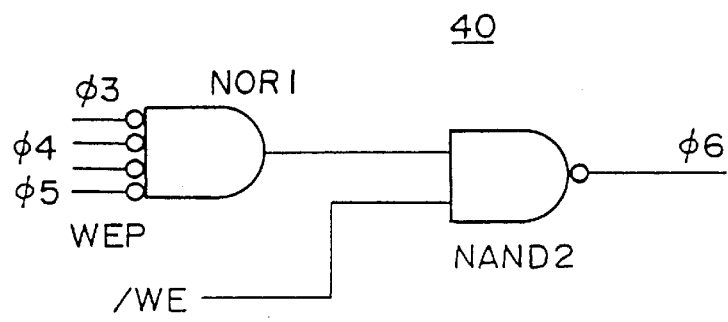
FIG. 6 is a circuit diagram showing a portion of a second embodiment of the present invention, which includes a modified embodiment of the step-up control circuit of FIG. 5.

In a second embodiment of the present invention, a step-up operation is only performed in the write cycle in order to further reduce current consumption. Such an embodiment can be realized by simply inserting a second NAND gate NAND2 in the back stage of the first NOR gate NOR1 as shown in FIG. 6. The output of the first NOR gate NOR1 is supplied to one input terminal of the second NAND gate NAND2 and the write enable signal /WE is supplied to the other input terminal. With this configuration, the signal φ6, which is the output of the second NAND gate NAND2, changes to logic H only in the write cycle so no step-up operation is performed in the read cycle.

Embodiment 3

In a third embodiment of the present invention, when the power source voltage Vdd exceeds a certain voltage VOP, the amplitude of the step-up driving signal φ1, which controls the step-up capacitor C1, is limited using a constant voltage circuit. This prevents an increase in current consumption due to excessive step-up. In an alternative embodiment, the step-up operation itself is inactivated in such a case.

Figure 7:
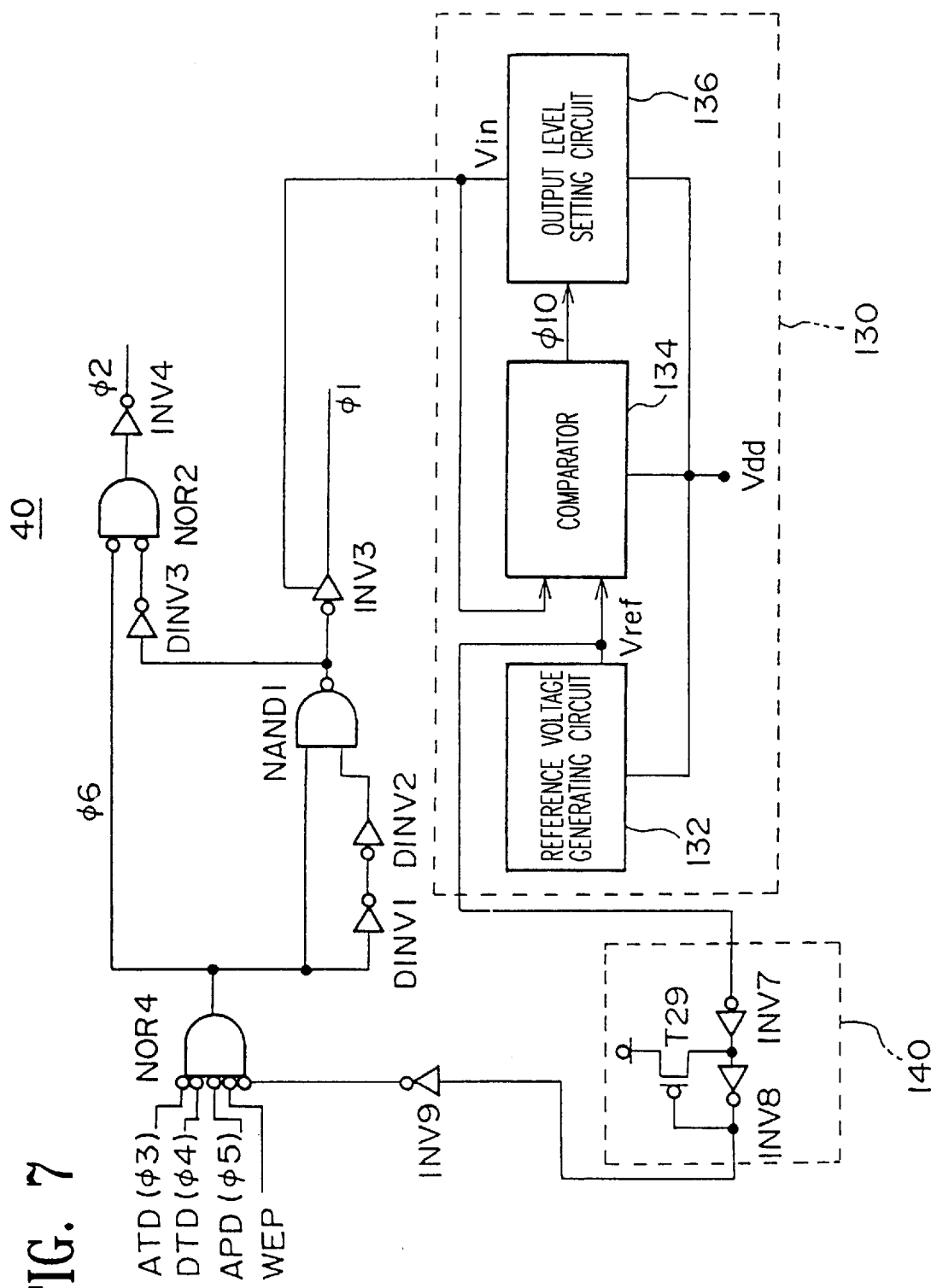
FIG. 7 is a circuit diagram showing a portion of a third embodiment of the present invention, which includes another modified embodiment of the step-up control circuit of FIG. 5.

As shown in FIG. 7, in a preferred embodiment, a constant voltage circuit 130, a step-up/non step-up switching circuit 140, and an inverter INV9 are provided in the step-up control circuit 40 in addition to the elements shown in FIG. 5.

The constant voltage circuit 130 is composed of a reference voltage generating circuit 132, a comparator 134, and an output level setting circuit 136. The reference voltage generating circuit 132 outputs a constant reference voltage Vref regardless of the power source voltage Vdd. The comparator 134 compares the voltage Vin set by the output level setting circuit 136 to the reference voltage Vref and outputs a control signal φ10 based on the comparison. The output level setting circuit 136 operates with the power source voltage Vdd as its operation voltage, and outputs the set voltage Vin based on the control signal φ10.

The step-up/non step-up switching circuit 140 outputs a signal to inactivate the step-up operation when the power source voltage Vdd is equal to or exceeds a certain voltage VOP. In particular, the step-up/non step-up switching circuit 140 receives the reference voltage Vref, which is output by the reference voltage generating circuit 132, at a first inverter INV7. If the logic level of the first inverter INV7 is lower than the reference voltage Vref, logic H is output from the step-up/non step-up switching circuit 140. Thus, logic L is input to the NOR gate NOR4 by way of the inverter INV9, so the step-up operation is performed in the same manner as in the first embodiment. On the other hand, if the logic level of the first inverter INV7 is higher than the reference voltage Vref, logic L is output from the step-up/non step-up switching circuit 140 to inactivate the step-up operation. Thus, if the power source voltage Vdd is equal to or exceeds a certain voltage, the step-up operation is inactivated in the third embodiment.

Further, the output voltage Vin of the output level setting circuit 136 of the constant voltage circuit 130 is connected to the positive power source terminal of the inverter INV3. Accordingly, when the voltage of the step-up driving signal φ1, which is output by the inverter INV3, reaches the output voltage Vin of the output level setting circuit 136, the voltage level of the step-up driving signal φ1 will not be raised any higher.

Embodiment 4

Figure 8:
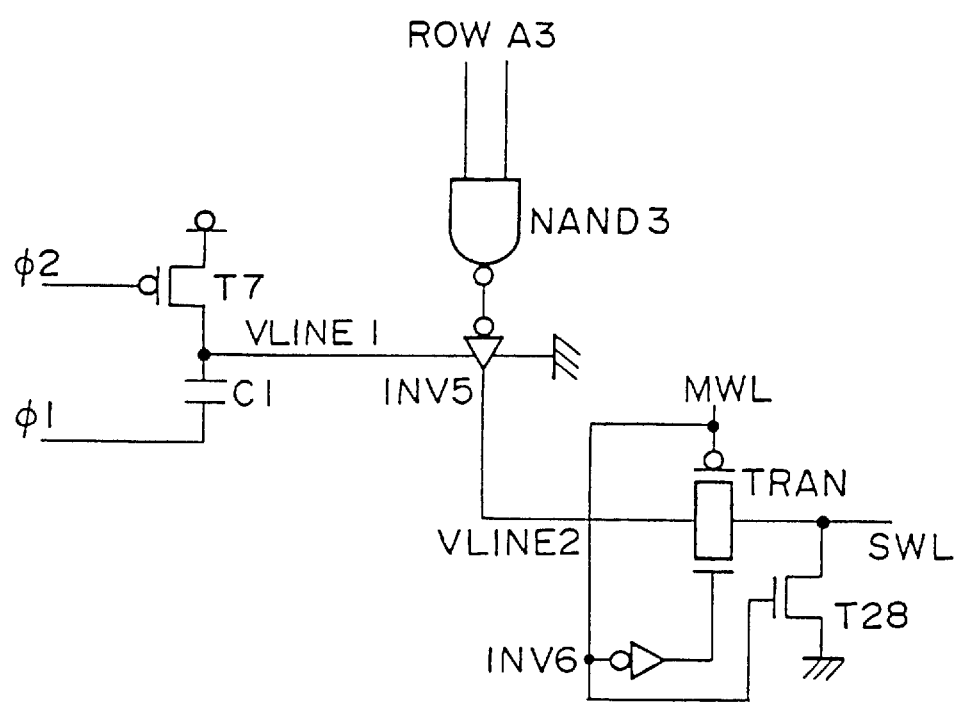
FIG. 8 is a circuit diagram showing a portion of a fourth embodiment of the present invention, in which a transmission gate is used in selecting word lines.

In a fourth embodiment of the present invention, transmission gates are used in word line selection. FIG. 8 illustratively shows a portion of the fourth embodiment in which a transmission gate is used in selecting the word line. The precharge transistor T7, the step-up capacitor C1, and the first step-up line VLINE1 are the same as in the previous embodiments. However, the block selective signal A3 and a row selective signal ROW are input to the NAND gate NAND3, and the output thereof is input to an inverter INV5, which functions as the block selective circuit. The first step-up line VLINE1 is connected to the positive power source terminal of the inverter INV5 to step-up the output signal thereof. The output of the inverter INV5 is input to a transmission gate TRAN by way of the second step-up line VLINE2. The transmission gate TRAN is controlled by a main word line (MWL) selection signal in order to select a sub word line SWL which is divided into blocks. More specifically, an inverted signal of the main word line MWL signal is output from an inverter INV6 to one of the transistors forming the transmission gate. When the MWL signal falls to logic L, the transmission gate TRAN is turned on, so signal of the stepped-up second step-up line VLINE2 is transmitted to the sub word line SWL. Thus, the sub word line SWL is stepped up. When the MWL signal charges to logic H, the transmission gate TRAN is turned off, so the sub word line SWL is lowered to logic L by an NMOS transistor T28. Thus, the sub word line SWL goes to the non-selective state.

Embodiment 5

A fifth embodiment of the present invention will now be described with reference to FIGS. 9–12.

Figure 9:
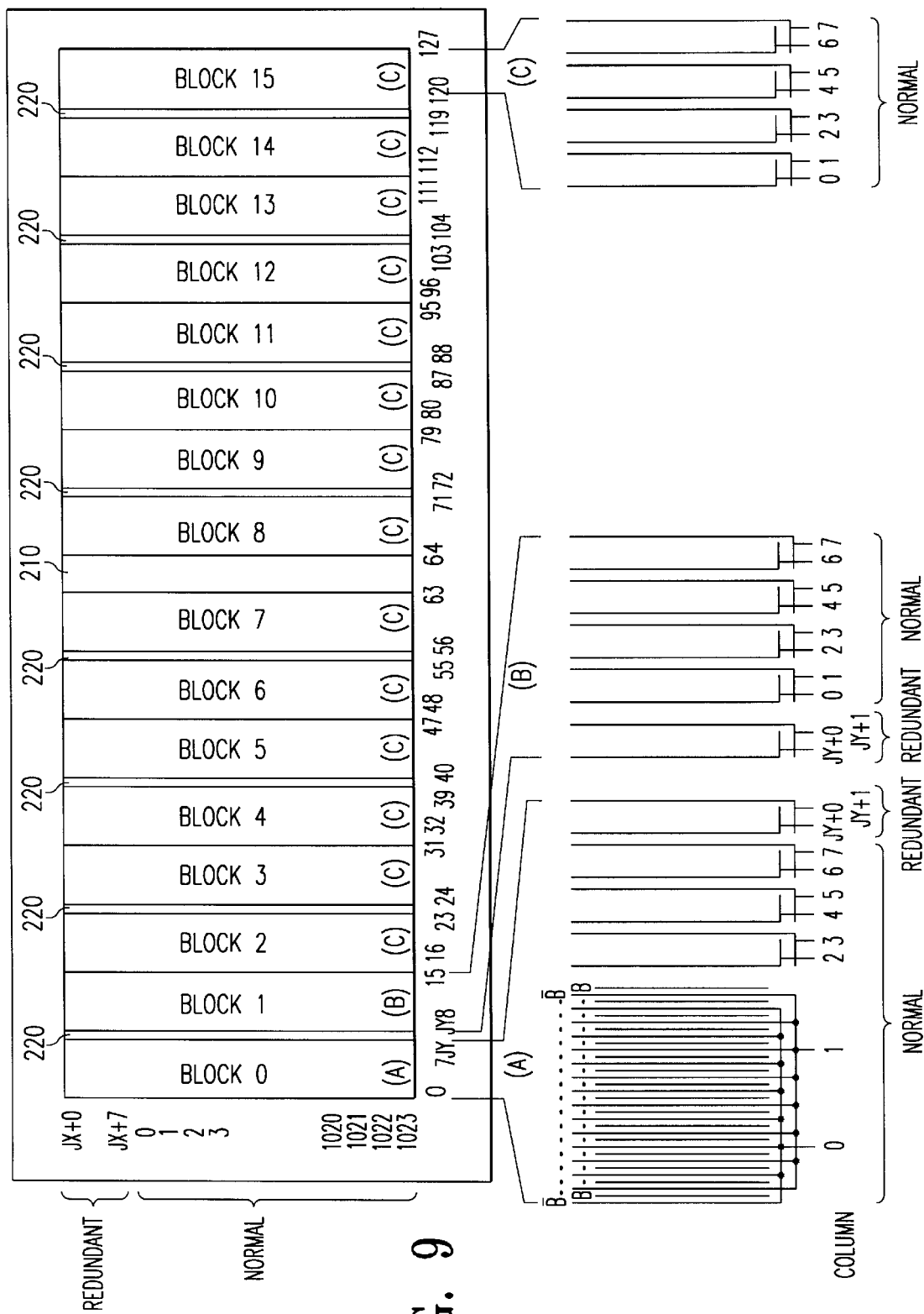
FIG. 9 is an overall configuration showing the block division in a semiconductor memory device according to a fifth embodiment of the present invention.
Figure 10:
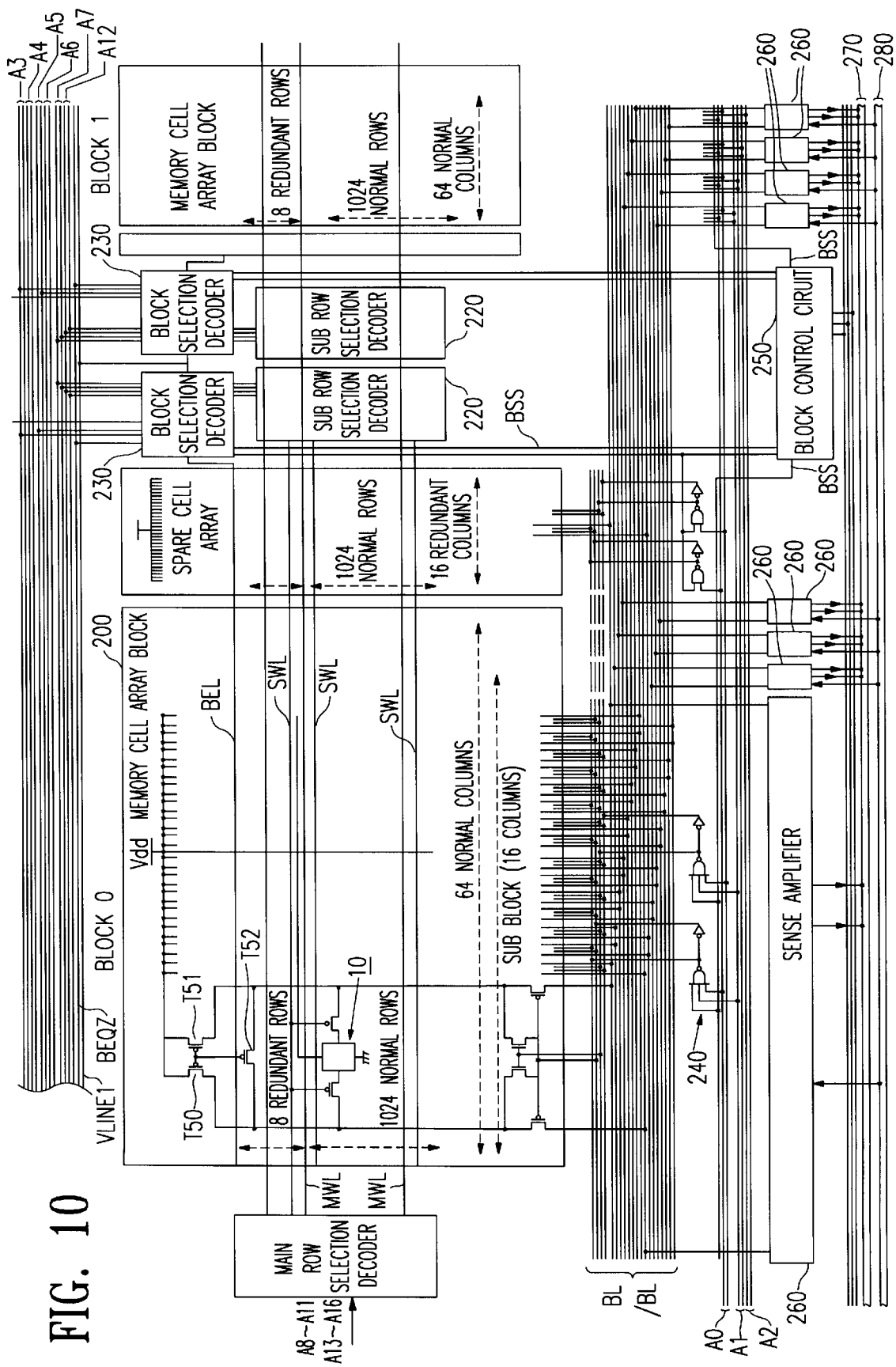
FIG. 10 is an overall configuration showing two of the sixteen blocks shown in FIG. 9 in an enlarged view.

FIG. 9 shows the overall configuration including the block division of the memory cell array blocks in a semiconductor memory device according to a fifth embodiment of the present invention. FIG. 10 shows the overall configuration of two of the memory cell array blocks shown in FIG. 9 in an enlarged view. As shown in FIG. 9, sixteen memory cell array blocks (with block numbers 0–15) are provided in the device. In each memory cell array block 200, 1024×64 normal memory cells 10 are arranged, as shown in FIG. 10. Additionally, 256 main word lines MWL are provided and 4 sub word lines SWL for are provided for each main word line MW1, so that a total of 1024 sub word lines SWL are provided. The 256 main word lines MWL are commonly used by all 16 of the memory cell array blocks 200. Further, 64 pairs of bit lines BL and /BL are provided, and each memory cell 10 is connected to one sub word line SWL and one pair of bit lines BL and /BL. Two redundant main word lines RMWL, and eight redundant sub word lines RSWL are also provided and sixteen pairs of redundant bit lines BL and /BL are provided in a redundant memory cell array.

The 256 main word lines MWL are connected to a main row selective decoder 210, which receives the main row address signals of higher rank A8–A11 and A13–A16 and activates a single main word line MWL. The 1024 sub word lines SWL are connected to sub row selective decoders 220, one of which is provided in each block 200. A single sub word line is activated by the sub row selective decoder 220, as will be described below. In order to select one of the sixteen memory cell array blocks 200, a block selective decoder 230 is provided. Each block selective decoder receives two of the block selective address signals A3–A6 and the two sub row address signals of lower rank A7 and A12, which select the sub word line SWL. Further, the first step-up line VLINE1 is connected to the block selective decoder 230, as will be described below.

The pairs of bit lines BL and /BL are coupled to data buses BL and /BL by means of a column gate 12, just as in the first embodiment of FIG. 3. The column gate 12 is driven by a column selective signal from a column selective decoder 240 constructed by a NAND gate NAND4. More specifically, block selective signal BSS and column address signals A0–A2 are input to the column selective decoder 240 in order to output a signal that simultaneously selects eight pairs of bit lines BL and /BL in a single block 200. In other words, each memory cell array block 200 is divided into eight sub blocks (with column numbers 0–7) corresponding to the eight pairs of bit lines selected simultaneously, as shown in FIG. 9. Further, the block selective signal BSS is generated in the block selective decoder 230 and is supplied to the column selective decoder 240 by way of the block control circuit 250. The data buses BL and /BL are coupled to a read bus 270 and a write bus 280 by means of eight sense amplifiers 260, which are controlled by the block control circuit 250.

Next, the sub row selective decoder 220 and the block selective decoder 230 will be described in detail with reference to FIGS. 11 and 12.

Figure 11:
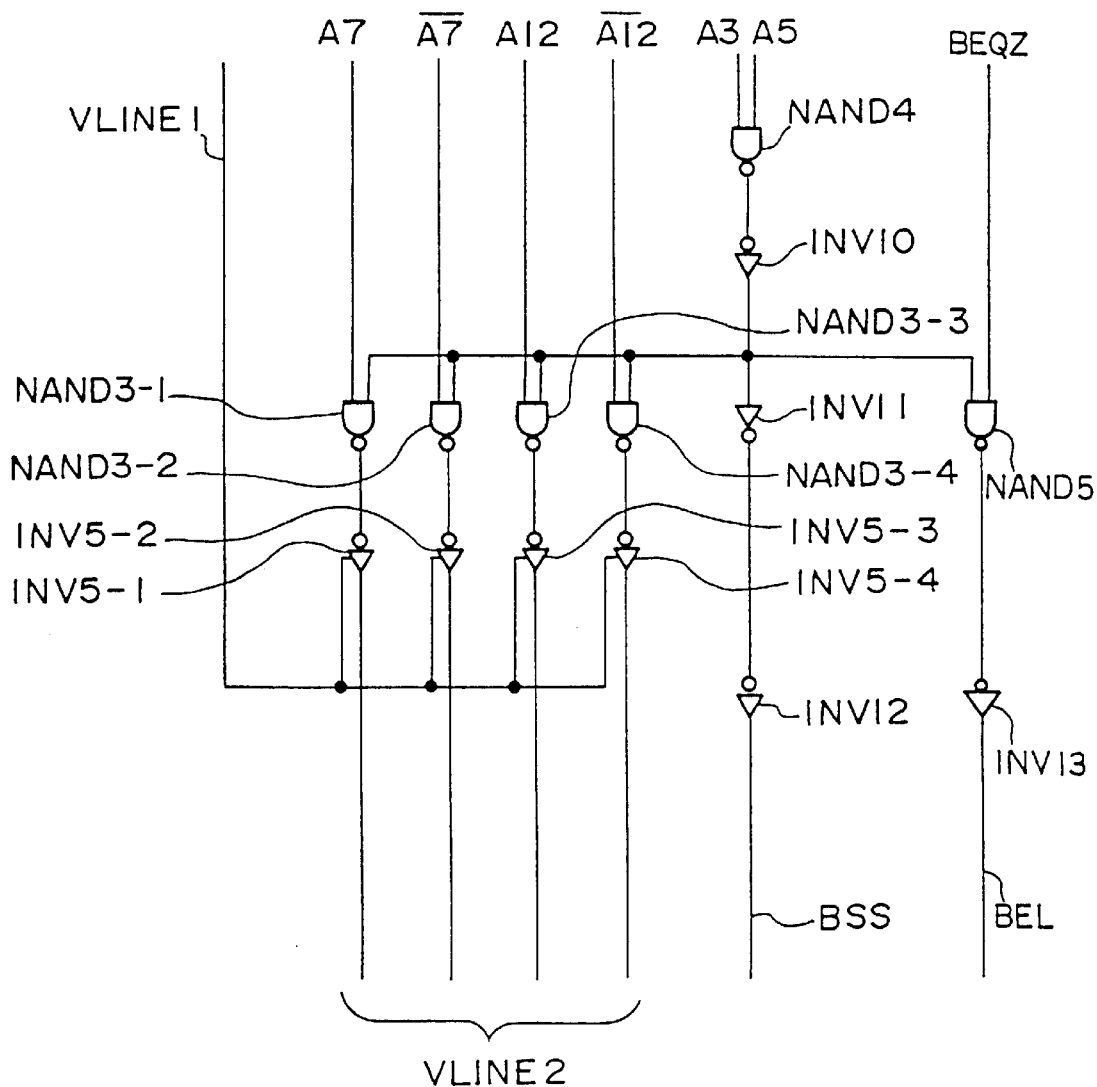
FIG. 11 is a circuit diagram showing a preferred embodiment of the block selective decoder and sub row selective decoder of FIG. 10.
Figure 12:
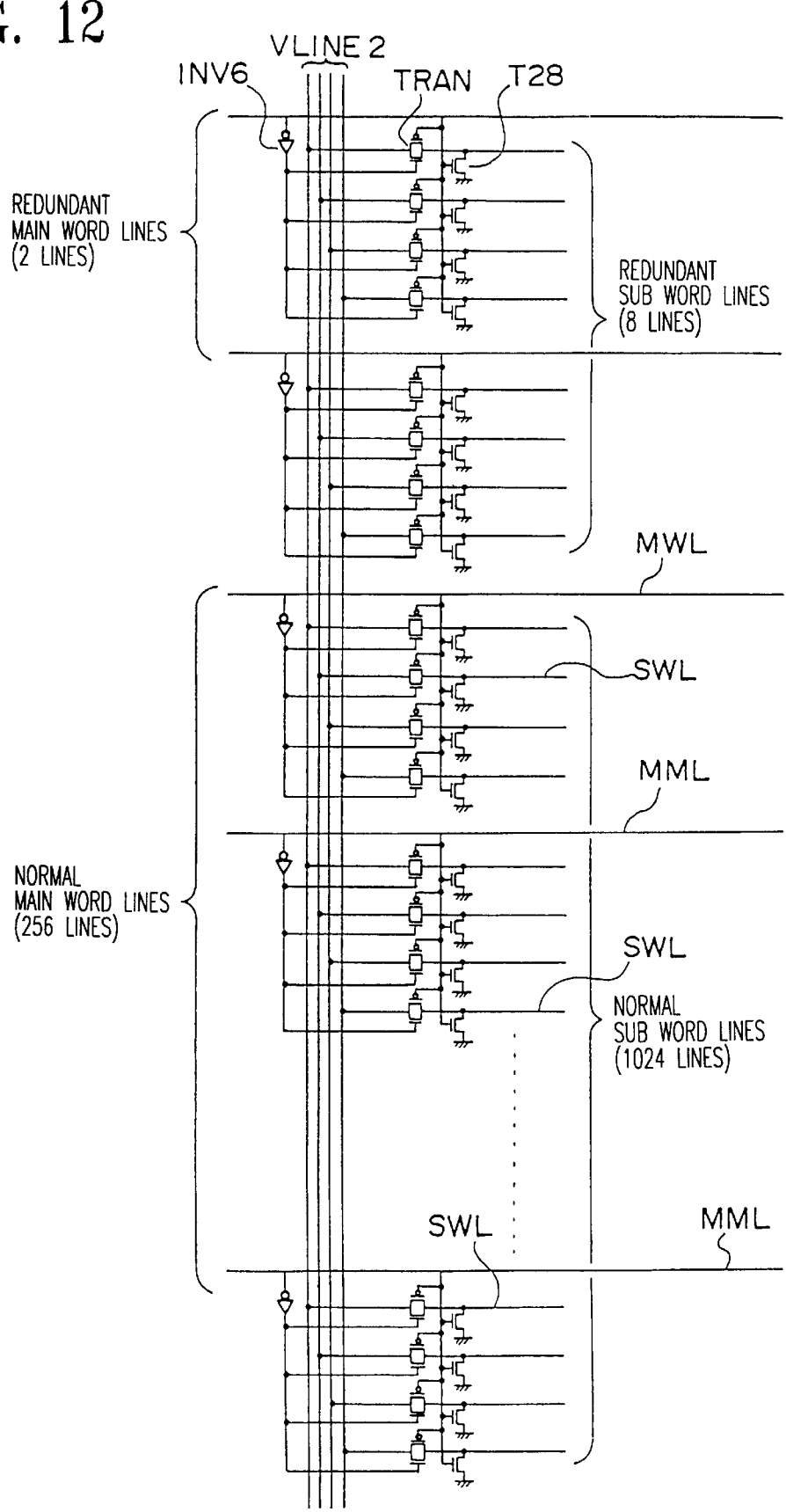
FIG. 12 is a circuit diagram showing a portion of the circuit of FIG. 10 in which a transmission gate is used to connect the second step-up line and the sub word line.

FIGS. 11 and 12 respectively show preferred embodiments of the block selective decoder 230 and the sub row selective decoder 220 for the first memory cell array block 200 (i.e., for block number 0). As shown in FIG. 11, block selective decoder 230 is constructed of a main NAND gate NAND4 that receives two (for example, A3 and A5) of the block selective address signals A3–A6. When the two signals are both at logic H, the main NAND gate NAND4 outputs logic L, which means that the corresponding block 200 (e.g., block number 0) is selected. When the corresponding block 200 is selected, the output of logic L from the main NAND gate NAND4 is supplied to the block control circuit 250 as a block selective signal BSS of logic H, by way of three inverters INV10, 11, and 12.

Additionally, the block selective decoder 230 has four NAND gates NAND3-1 to 3-4, each of which receives one of the 2-bit row address signals A7, /A7, A12, and /A12 and the output of the inverter INV10. When the corresponding block 200 is selected, logic L is output from one of the four NAND gates NAND3 based on the row address signal. Further, the block selective decoder 230 includes four inserters INV5-1 to 5-4, each of which is in the back stage of one of the four NAND gates NAND3-1 to 3-4. The positive power source terminal of each of the inverters INV5-1 to 5-4 is connected to the first step-up line VLINE1, which is configured in the same manner as shown in FIG. 3. In other words, the first step-up line VLINE1, which is connected to the positive power source terminals of the inverters INV5-1 to 5-4, reaches the power source voltage Vdd when φ2 is in the precharge state of logic L. Then, it is raised to the level of Vdd+ΔV by raising the signal φ1 from logic L to H and starting the step-up operation, as shown in FIG. 4. Accordingly, when both block address signals A3 and A5 are at logic H and one of the row address signals A7, /A7, A12, and/A12 is at logic H, the output potential of one inverter (to which logic L is input) is Vdd during the precharging period and Vdd+ΔV during the stepping up period.

The four output lines of the inverters INV5-1 to 5-4 are the second step-up lines VLINE2 that are connected to the four sub word lines SWL provided for each main word line MWL by means of transfer gates TRAN, as shown in FIG. 12. Each transfer gate TRAN is turned on/off by one of the MWL signals (and its inverted signal) that is generated by the main row selective decoder 210 based on the upper row address signals A8–A11 and A13–A16, just as in FIG. 8. In the fifth embodiment, when the MWL signal is at logic L (and its inverted signal is at logic H), four transfer gates TRAN turn on to activate a single sub word line SWL. Thus, eight memory cells 10 are simultaneously read out/written in by activating a single sub word line SWL within a single block based on the block address signals A3–A6 and the upper and lower row address signals A7–A16, and by selecting eight pairs of bit lines BL and /BL within a single block based on the block address signals A3–A6 and the column address signals A0–A2. Further, in the fifth embodiment, a single word line W (i.e., sub word line SWL) selected by the row address signal within a single memory cell array block 200 selected by the block address signal is stepped up in both the write cycle and the read cycle using the step-up control circuit 40 of the previous embodiments, in a manner similar to that shown in FIG. 4.

In the fifth embodiment of the present invention the bit line precharge transistors T50 and T51 and the bit line equalize transistor T52 are all turned on so that the pairs of bit lines BL and/BL are precharged and equalized at the power source voltage Vdd (see FIG. 10). Accordingly, the block selective decoder 230 has another NAND gate NAND5 that receives the output of the inverter INV10 and the bit line equalizing signal BEQZ, as shown in FIG. 11. Logic H is output from the NAND gate NAND5 when the block selective signals (e.g., A3 and A5) are at logic H to select the corresponding memory cell array block 200 and the bit line equalizing signal BEQZ is at logic L. The output of the NAND gate NAND5 is inverted by an inverter INV13 and then supplied to the bit line equalizing line BEL, as shown in FIGS. 10 and 11. The precharge and equalizing transistors T50–T52 are turned on when the signal supplied to the bit line equalizing line BEL is at logic L. When the bit line equalizing signed BEQZ is at logic H, the transistors T50, T51, and T52 are turned off Further, when the sub word line SWL is at logic L, the pair of bit lines BL and /BL is in a floating state.

If a time lag ΔT is provided between the selection of a sub word line SWL and the beginning of the step-up operation, the signal potential that appears on the bit lines in the floating state can be completely discharged before the step-up operation is begun. This process will now be described with reference to FIG. 3, which shows the overall configuration of the memory cell 10 used in the embodiment of FIG. 10. The power supply voltage Vdd is supplied to a single sub word line SWL within the block 200 by raising the precharge signal φ2 and selecting one of the multiple memory cell array blocks 200 based on the block selective signals A1 and A2. Assuming that the signal potentials of nodes A and B are at logic H and L, respectively, the transistors T20, T21, and T23 of FIG. 3 are turned on. With the configuration of FIG. 10, the signal potential L of node B is coupled to the bit line /BL when it is in the floating state. The bit line /BL will then be completely discharged within the time lag period of ΔT by means of the transistor T23. Therefore, the data in the memory cell 10 is not destroyed as no current will flow to the memory cell 10 from the bit lines if the step-up operation of the sub word line SWL is started after the bit line /BL is completely discharged.

While there has been illustrated and described what are presently considered to be the preferred embodiments of the present invention, it will be understood by those in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A semiconductor memory device having:
   a plurality of static memory cells connected to pairs of bit lines, which are arranged in columns, and word lines, which are arranged in rows, at intersections of the bit lines and the word lines;
   a plurality of memory cell array blocks formed by dividing a region in which the memory cells are arranged into blocks in the direction of the word lines, each word line being divided into segments such that each segment is connected to the memory cells in one of the memory cell array blocks;
   a first step-up line that is used in stepping up one of the word lines, regardless of which memory cell array block is selected;
   a step-up capacitor having a first terminal connected to the first step-up line;
   a switching circuit connected between a power source potential and the first terminal of the step-up capacitor;
   a step-up control circuit that outputs a precharge control signal to precharge the step-up capacitor by turning on the switching circuit and a step-up driving signal that varies the potential of a second terminal of the step-up capacitor to control the step-up of the first step-up line;
   a plurality of second step-up lines, each of the second step-up lines corresponding to one of the memory cell array blocks,
   a plurality of block selective circuits that operate to select a single one of the memory cell array blocks based on block address signals, each of the block selective circuits corresponding to one of the memory cell array blocks; and
   a row selective circuit that operates to select a single one of the word lines based on row address signals,
   wherein the single word line selected by the row selective circuit within the single memory cell array block selected by the block selective circuits is stepped up by way of the first step-up line and one of the second step-up lines.

2. The semiconductor memory device as defined in claim 1, wherein the step-up control circuit steps up a selected word line using the first and second step-up lines by raising the potential of the second terminal of the step-up capacitor using the step-up driving signal, after completing the precharge of the step-up capacitor by turning off the switching circuit using the precharge control signal.

3. The semiconductor memory device as defined in claim 1, wherein the step-up control circuit starts the precharge of the step-up capacitor by turning on the switching circuit using the precharge control signal, after completing the step-up of the single selected word line by lowering the potential of the second terminal of the step-up capacitor using the step-up driving signal.

4. The semiconductor memory device as defined in claim 1, further comprising an address transition detecting circuit that detects changes in the row address signals, the step-up control circuit changing the precharge control signal and the step-up driving signal based on a detection signal from the address transition detecting circuit.

5. The semiconductor memory device as defined in claim 1, further comprising a data transition detecting circuit that detects changes in input data to be written in the memory cells, the step-up control circuit changing the precharge control signal and the step-up driving signal based on a detection signal from the data transition detecting circuit.

6. The semiconductor memory device as defined in claim 1, further comprising a write enable signal transition detecting circuit that detects changes in a write enable signal, the step-up control circuit changing the precharge control signal and the step-up driving signal based on a detection signal from the write enable signal transition detecting circuit.

7. The semiconductor memory device as defined in claim 6, wherein the step-up control circuit raises the potential of the second terminal of the step-up capacitor using the step-up driving signal to step-up a selected word line only for a write cycle.

8. The semiconductor memory device as defined in claim 6, wherein the precharge control signal and the step-up driving signal are changed for both a write cycle and a read cycle, on the basis of the detection signal, which is generated on both the rising edge and falling edge of the write enable signal, from the write enable signal transition detecting circuit.

9. The semiconductor memory device as defined in claim 1, wherein the step-up control circuit raises the potential of the second terminal of the step-up capacitor using the step-up driving signal to step-up the selected word line only when power is on, based on an auto power-down signal that is used to activate the word line for a predetermined power-on period.

10. The semiconductor memory device as defined in claim 1, wherein the step-up control circuit includes a step-up/non step-up switching circuit that lowers the potential of the second terminal of the step-up capacitor using the step-up driving signal to inactivate the step-up operation, when the power source potential exceeds a predetermined voltage.

11. The semiconductor memory device as defined in claim 1, wherein the step-up control circuit includes a control circuit that controls the maximum voltage of the step-up driving signal when the power source potential is over a predetermined voltage.

12. A semiconductor memory device comprising:

a plurality of static memory cells connected to pairs of bit lines, which are arranged in columns, and sub word lines, which are arranged in rows, at intersections of the bit lines and the sub word lines;

a plurality of memory cell array blocks formed by dividing a region in which the memory cells are arranged into blocks in the direction of the sub word lines, each sub word line being divided into segments such that each segment is connected to the memory cells in one of the memory cell array blocks;

N main word lines arranged over the memory cell array blocks, n of the sub word lines being selected by activating one of the N main word lines;

a first step-up line that is used in stepping up one of the sub word lines, regardless of which memory cell array block is selected;

a step-up capacitor having a first terminal connected to the first step-up line;

a switching circuit connected between a power source potential and the first terminal of the step-up capacitor;

a step-up control circuit that outputs a precharge control signal to precharge the step-up capacitor by turning on the switching circuit and a step-up driving signal that varies the potential of a second terminal of the step-up capacitor to control the step-up of the first step-up line;

a plurality of second step-up lines, n second step-up lines corresponding to each of the memory cell array blocks;

a block selective circuit that operates to select a single one of the memory cell array blocks based on block address signals;

a sub row selective circuit that operates to select one of n sub word lines based on sub row address signals; and a main row selective circuit commonly used by the memory cell array blocks, the main row selective circuit selecting a single one of the main word lines based on main row address signals, wherein the single sub word line, which is selected by a combination of the sub row selective circuit and the main row selective circuit, within the single memory cell array block, which is selected by the block selective circuit, is stepped up by way of the first step-up line and one of the second step-up lines.

13. The semiconductor memory device as defined in claim 12, further comprising a plurality of transfer gates, each of the transfer gates being provided between one of the n second step-up lines and one of the n sub word lines and and being controlled by the level of one of the main word lines.

14. The semiconductor memory device as defined in claim 12, wherein the step-up control circuit steps up a selected sub word line using the first and second step-up lines by raising the potential of the second terminal of the step-up capacitor using the step-up driving signal, after completing the precharge of the step-up capacitor by turning off the switching circuit using the precharge control signal.

15. The semiconductor memory device as defined in claim 12, wherein the step-up control circuit starts the precharge of the step-up capacitor by turning on the switching circuit using the precharge control signal, after completing the step-up of the single selected sub word line by lowering the potential of the second terminal of the step-up capacitor using the step-up driving signal.

16. The semiconductor memory device as defined in claim 12, further comprising an address transition detecting circuit that detects changes in the row address signals, the step-up control circuit changing the precharge control signal and the step-up driving signal based on a detection signal from the address transition detecting circuit.

17. The semiconductor memory device as defined in claim 12, further comprising a data transition detecting circuit that detects changes in input data to be written in the memory cells, the step-up control circuit changing the precharge control signal and the step-up driving signal based on a detection signal from the data transition detecting circuit.

18. The semiconductor memory device as defined in claim 12, further comprising a write enable signal transition detecting circuit that detects changes in a write enable signal, the step-up control circuit changing the precharge control signal and the step-up driving signal based on a detection signal from the write enable signal transition detecting circuit.

19. The semiconductor memory device as defined in claim 18, wherein the step-up control circuit raises potential of the second terminal of the step-up capacitor using the step-up driving signal to step-up a selected sub word line only for a write cycle.

20. The semiconductor memory device as defined in claim 18, wherein the precharge control signal and the step-up driving signal are changed for both a write cycle and a read cycle, on the basis of the detection signal, which is generated on both the rising edge and falling edge of the write enable signal, from the write enable signal transition detecting circuit.

21. The semiconductor memory device as defined in claim 12, wherein the step-up control circuit raises the potential of the second terminal of the step-up capacitor using the step-up driving signal to step-up the selected sub word line only when power is on, based on an auto power-down signal that is used to activate the main word line and the sub word line for a predetermined power-on period.

22. The semiconductor memory device as defined in claim 12, wherein the step-up control circuit includes a step-up/non step-up switching circuit that lowers the potential of the second terminal of the step-up capacitor using the step-up driving signal to inactivate the step-up operation when the power source potential exceeds a predetermined voltage.

23. The semiconductor memory device as defined in claim 12, wherein the step-up control circuit includes a control circuit that controls the maximum voltage of the step-up driving signal when the power source potential is over a predetermined voltage.

24. A method of stepping up a word line in a semiconductor memory device of the type having a plurality of static memory cells connected to pairs of bit lines, which are arranged in columns, and word lines, which are arranged in rows, at intersections of the bit lines and the word lines, said method comprising the steps of:

provinding a plurality of memory cell array blocks that are formed by dividing a region in which the memory cells are arranged into blocks in the direction of the word lines, each word line being divided into segments such that each segment is connected to memory cells in one of the memory cell array blocks;

providing a single step-up capacitor that is used for all of the memory cell array blocks;

precharging the step-up capacitor by supplying a power source potential to its first terminal;

supplying the power source potential to a single selected word line within a single selected memory cell array block based on block address signals and row address signals; and stepping up the single selected word line within the single selected memory cell array block by raising the potential of a second terminal of the step-up capacitor, after a first predetermined period, wherein the selected word line is stepped up when data is written to one of the memory cells connected to the selected word line.

25. The method of stepping up a word line as defined in claim 24, further comprising the step of turning on a bit line precharge circuit for a second predetermined period to precharge the pairs of bit lines to the power source potential.

26. The semiconductor memory device as defined in claim 2, wherein the step-up control circuit starts the precharge of the step-up capacitor by turning on the switching circuit using the precharge control signal, after completing the step-up of the single selected word line by lowering the potential of the second terminal of the step-up capacitor using the step-up driving signal.

27. The semiconductor memory device as defined in claim 4, further comprising a data transition detecting circuit that detects changes in input data to be written in the memory cells, the step-up control circuit changing the precharge control signal and the step-up driving signal based on a detection signal from the data transition detecting circuit.

28. The semiconductor memory device as defined in claim 27, further comprising a write enable signal transition detecting circuit that detects changes in a write enable signal, the step-up control circuit changing the precharge control signal and the step-up driving signal based on a detection signal from the write enable signal transition detecting circuit.

29. The semiconductor memory device as defined in claim 28, wherein the step-up control circuit raises the potential of the second terminal of the step-up capacitor using the step-up driving signal to step-up the selected word line only when power is on, based on an auto power-down signal that is used to activate the word line for a predetermined power-on period.

30. The semiconductor memory device as defined in claim 10, wherein the step-up control circuit includes a control circuit that controls the maximum voltage of the step-up driving signal when the power source potential is over a predetermined voltage.

31. The semiconductor memory device as defined in claim 13, wherein the step-up control circuit steps up a selected sub word line using the first and second step-up lines by raising the potential of the second terminal of the step-up capacitor using the step-up driving signal, after completing the precharge of the step-up capacitor by turning off the switching circuit using the precharge control signal.

32. The semiconductor memory device as defined in claim 31, wherein the step-up control circuit starts the precharge of the step-up capacitor by turning on the switching circuit using the precharge control signal, after completing the step-up of the single selected sub word line by lowering the potential of the second terminal of the step-up capacitor using the step-up driving signal.

33. The semiconductor memory device as defined in claim 16, further comprising a data transition detecting circuit that detects changes in input data to be written in the memory cells, the step-up control circuit changing the precharge control signal and the step-up driving signal based on a detection signal from the data transition detecting circuit.

34. The semiconductor memory device as defined in claim 33, further comprising a write enable signal transition detecting circuit that detects changes in a write enable signal, the step-up control circuit changing the precharge control signal and the step-up driving signal based on a detection signal from the write enable signal transition detecting circuit.

35. The semiconductor memory device as defined in claim 34, wherein the step-up control circuit raises the potential of the second terminal of the step-up capacitor using the step-up driving signal to step-up the selected sub word line only when power is on, based on an auto power-down signal that is used to activate the main word line and the sub word line for a predetermined power-on period.

36. The semiconductor memory device as defined in claim 22, wherein the step-up control circuit includes a control circuit that controls the maximum voltage of the step-up driving signal when the power source potential is over a predetermined voltage.

37. The method of stepping up a word line as defined in claim 24, wherein the single selected word line is stepped up by raising the potential of the second terminal of the step-up capacitor, after the precharge of the step-up capacitor is completed.

38. The method of stepping up a word line as defined in claim 37, wherein the precharge of the step-up capacitor is started after the step-up of the single selected word line is completed.

39. The method of stepping up a word line as defined in claim 24, wherein the precharge of the step-up capacitor is started after the step-up of the single selected word line is completed.

40. A semiconductor memory device comprising:

a plurality of static memory cells connected to pairs of bit lines, which are arranged in columns, and word lines, which are arranged in rows, at intersections of the bit lines and the word lines;

an address information source for providing a column address and a row address signal;

a plurality of memory cell array blocks formed by dividing a region in which the memory cells are arranged into blocks in the direction of the word lines, each word line being divided into segments such that each segment is connected to the memory cells in one of the memory cell array blocks;

a first step-up line that is used in stepping up one of the word lines, regardless of which memory cell array block is selected;

a step-up circuit that steps-up the first step-up line, wherein the step-up circuit comprises a step-up capacitor having a first terminal connected to the first step-up line and a second terminal, and a control circuit connected to the second terminal of the capacitor for raising the potential of the second terminal of the capacitor;

a plurality of second step-up lines, each of the second step-up lines corresponding to one of the memory cell array blocks;

a plurality of block selective circuits that operate to select a single one of the memory cell array blocks based on block address signals derived from the column and/or row address signals, each of the block selective circuits corresponding to one of the memory cell array blocks, wherein the second step-up line corresponding to the selected memory cell array block is stepped up by way of the first step-up line; and a row selective circuit that operates to select a single one of the word lines based on row address signals;

wherein the single word line selected by the row selective circuit within the single memory cell array block selected by the block selective circuits is stepped up by way of the first step-up line and one of the second step-up lines.

41. A semiconductor memory device comprising:

a plurality of static memory cells connected to pairs of bit lines, which are arranged in columns, and sub word lines, which are arranged in rows, at intersections of the bit lines and the sub word lines;

an address information source for providing a column address, a main row address and a sub row address signal;

a plurality of memory cell array blocks formed by dividing a region in which the memory cells are arranged into blocks in the direction of the sub word lines, each sub word line being divided into segments such that each segment is connected to the memory cells in one of the memory cell array blocks;

N main word lines arranged over the memory cell array blocks, n of the sub word lines being selected by activating one of the N main word line;

a first step-up line that is used in stepping up one of the sub word lines, regardless of which memory cell array block is selected;

a step-up circuit that step-up the first step-up line, wherein the step-up circuit comprises a step-up capacitor having a first terminal connected to the first step-up line and a second terminal, and a control circuit connected to the second terminal of the capacitor for raising the potential of the second terminal of the capacitor;

a plurality of second step-up lines, n second step-up lines corresponding to each of the memory cell array blocks;

a block selective circuit that operates to select a single one of the memory cell array blocks based on block address signals derived from the column and/or sub row and/or main row address signals, wherein the second step-up line corresponding to the selected memory cell array block is stepped up by way of the first step-up line;

a sub row selective circuit that operates to select one of n sub word lines based on sub row address signals; and a main row selective circuit commonly used by the memory cell array blocks, the main row selective circuit selecting a single one of the main word lines based on main row address signals;

wherein the signal sub word line which is selected by a combination of the sub row selective circuit and the main row selective circuit, within the single memory cell array block, which is selected by the block selective circuits, is stepped up by way of the first step-up line and one of the second step-up lines.

* * * * *